US007806988B2

(12) United States Patent
Rana et al.

(10) Patent No.: US 7,806,988 B2
(45) Date of Patent: *Oct. 5, 2010

(54) METHOD TO ADDRESS CARBON INCORPORATION IN AN INTERPOLY OXIDE

(75) Inventors: Niraj Rana, Boise, ID (US); Kevin R. Shea, Boise, ID (US)

(73) Assignee: Micron Technology, Inc., Boise, ID (US)

(*) Notice: Subject to any disclaimer, the term of this patent is extended or adjusted under 35 U.S.C. 154(b) by 1051 days.

This patent is subject to a terminal disclaimer.

(21) Appl. No.: 10/951,997

(22) Filed: Sep. 28, 2004

(65) Prior Publication Data

US 2006/0065286 A1 Mar. 30, 2006

(51) Int. Cl.
*B08B 3/00* (2006.01)
*B08B 7/00* (2006.01)
(52) U.S. Cl. .............................. 134/28; 134/1.2; 134/26
(58) Field of Classification Search ..................... 134/2, 134/3, 26, 27, 28, 30, 32, 33, 36, 39
See application file for complete search history.

(56) References Cited

U.S. PATENT DOCUMENTS

| | | | | |
|---|---|---|---|---|
| 4,738,935 | A | * | 4/1988 | Shimbo et al. ............... 438/455 |
| 5,789,360 | A | * | 8/1998 | Song et al. .................. 510/175 |
| 5,821,158 | A | * | 10/1998 | Shishiguchi ................ 438/528 |
| 5,966,611 | A | * | 10/1999 | Jost et al. .................... 438/397 |
| 6,100,198 | A | * | 8/2000 | Grieger et al. ............... 438/692 |
| 6,133,109 | A | * | 10/2000 | Nam .......................... 438/396 |
| 6,273,108 | B1 | | 8/2001 | Bergman et al. |
| 6,416,586 | B1 | * | 7/2002 | Ohmi et al. .................... 134/1 |
| 6,423,146 | B1 | * | 7/2002 | Fukazawa ...................... 134/2 |
| 6,579,810 | B2 | | 6/2003 | Chang |
| 6,607,967 | B1 | * | 8/2003 | Pallinti et al. ............... 438/411 |
| 6,624,022 | B1 | | 9/2003 | Hurley et al. |
| 6,690,051 | B2 | | 2/2004 | Hurley et al. |
| 6,756,631 | B2 | | 6/2004 | Wu |
| 6,760,252 | B2 | | 7/2004 | Mikolajick |
| 6,884,733 | B1 | * | 4/2005 | Dakshina-Murthy et al. ..... 438/717 |
| 2001/0037822 | A1 | | 11/2001 | Elsawy et al. |

(Continued)

FOREIGN PATENT DOCUMENTS

EP        1235258        *    8/2002

(Continued)

OTHER PUBLICATIONS

Office Action of U.S. Appl. No. 11/493,053 dated Jul. 11, 2007.

(Continued)

*Primary Examiner*—Michael Cleveland
*Assistant Examiner*—Nicole Blan
(74) *Attorney, Agent, or Firm*—Wells St. John P.S.

(57) ABSTRACT

A method of removing a mask and addressing interfacial carbon chemisbored in a semiconductor wafer starts with placing the semiconductor wafer into a dry strip chamber. The dry stripping process is performed to remove the mask on the semiconductor wafer. The semiconductor wafer is then subjected to a cleaning solution to perform a cleaning process to remove particles on the surface of the semiconductor wafer and to address the interfacial carbon. The cleaning solution being either water containing ozone ($O_3$) and ammonia ($NH_3$), or a solution of hot phosphoric acid ($H_3PO_4$).

28 Claims, 4 Drawing Sheets

U.S. PATENT DOCUMENTS

| | | |
|---|---|---|
| 2002/0066717 A1* | 6/2002 | Verhaverbeke et al. ........ 216/13 |
| 2002/0189635 A1 | 12/2002 | Bodet et al. |
| 2003/0206445 A1 | 11/2003 | Forbes |
| 2004/0002430 A1 | 1/2004 | Verhaverbeke |
| 2004/0194813 A1 | 10/2004 | Riggs et al. |
| 2005/0074986 A1* | 4/2005 | Autryve et al. .............. 438/795 |
| 2005/0085072 A1 | 4/2005 | Kim et al. |

OTHER PUBLICATIONS

Office Action of U.S. Appl. No. 11/493,053 dated Dec. 19, 2007.
Office Action of U.S. Appl. No. 11/493,053 dated Apr. 15, 2008.
Office Action of U.S. Appl. No. 11/493,053 dated Nov. 17, 2008.
Office Action of U.S. Appl. No. 11/493,053 dated Apr. 28, 2009.
Office Action of U.S. Appl. No. 11/493,053 dated Nov. 17, 2009.
Kern, Handbook of Semiconductor Wafer Cleaning Technology, Noyes Publications, p. 19, 1993.

* cited by examiner

METHOD TO ADDRESS CARBON INCORPORATION IN AN INTERPOLY OXIDE

BACKGROUND OF THE INVENTION

The present invention relates generally to semiconductor fabrication, and in particular, to methods that address carbon incorporation in an interpoly oxide.

Uncontaminated substrates are critical to obtaining high yields in microelectronic device fabrication. While the fabrication process is generally designed to address as many sources of contamination as possible, often, the source of the contamination will be one of the processing steps. For example, multilayer layer resist masks are often used to pattern substrates. As prior art masks often comprise polymeric resins, photo-sensitizers, and organic solvents, residual polymers, organic components and particles are typically left on the surface of the device after the ashing process.

Prior art cleaning techniques to remove such contaminates include elongated dry-strips or regular wet-chemistries using solutions such as Piranha ($H_2SO_4/H_2O_2$) or SC1 ($H_2O/H_2O_2/NH_4OH$) solutions. Although these cleaning techniques have been suitable for their intended purposes, they have not been suitable in all cleaning situations.

SUMMARY OF THE INVENTION

It is against the above background that the present invention provides improvements and advancements over the prior art. In particular, the present invention overcomes the limitations of the prior art by washing a microelectronic substrate with either an ozonated ammonia water solution or hot phosphoric acid after a dry stripping process to address interfacial carbon chemisbored on polysilicon during deposition of an amorphous carbon mask.

In one exemplary embodiment, a method of removing interfacial carbon from a semiconductor wafer comprises providing the semiconductor wafer with interfacial carbon and using a first cleaning solution to perform a first cleaning process to remove the interfacial carbon on or near a surface of the semiconductor wafer. The first cleaning solution being either deionized water (DI water) containing ozone (O3) and ammonia (NH3), or a solution of hot phosphoric acid (H3PO4). The method also includes using a second cleaning solution to perform a second cleaning process to remove the residual first cleaning solution on the surface of the semiconductor wafer, the second cleaning solution being DI water, and spin-drying the semiconductor wafer.

These and other features and advantages of the invention will be more fully understood from the following description of preferred embodiments of the invention taken together with the accompanying drawings.

BRIEF DESCRIPTION OF THE DRAWINGS

The following detailed description of the embodiments of the present invention can be best understood when read in conjunction with the following drawings, where like structure is indicated with like reference numerals and in which.

DETAILED DESCRIPTION OF THE INVENTION

In the following description, certain specific details are set forth in order to provide a thorough understanding of various embodiments of the present invention. However, one skilled in the art will understand that the present invention may be practiced without these details. In other instances, well-known structures, processes, and materials associated with microelectronic device fabrication have not been shown in detail in order to avoid unnecessarily obscuring the description of the embodiments of the invention.

Figure 1A:
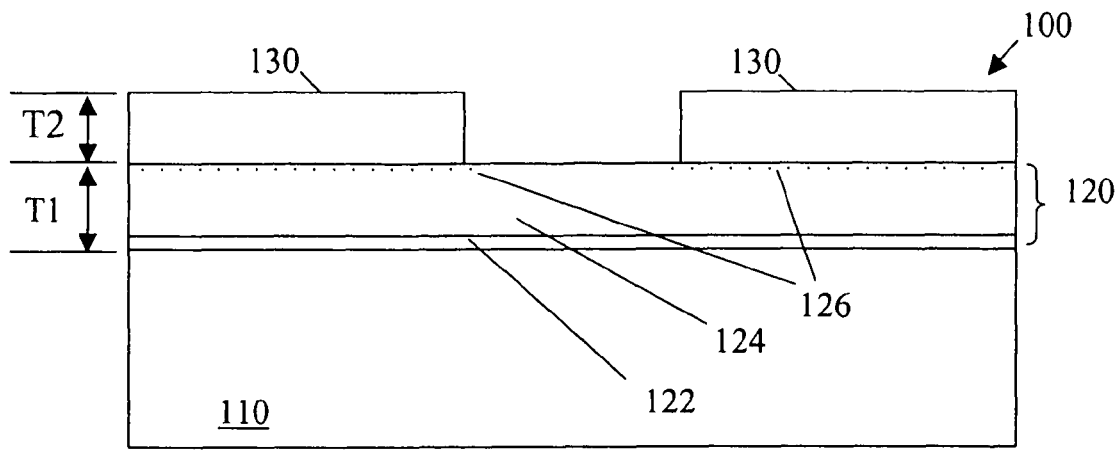
FIG. 1A shows a partially completed semiconductor wafer having portions covered with a patterned photoresist layer which may provide interfacial carbon to a device structure formed on the wafer.
Figure 1B:
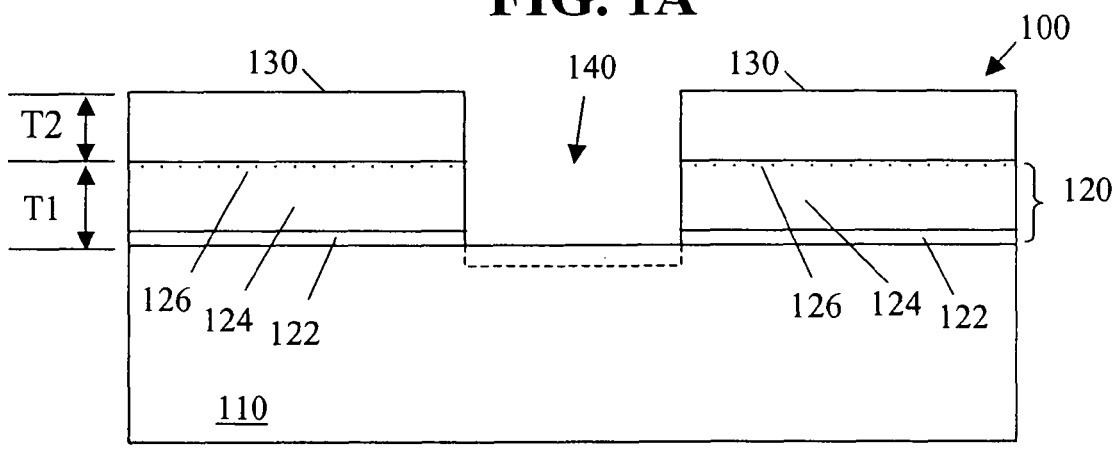
FIG. 1B shows the partially completed semiconductor wafer of FIG. 1A having portions etched.
Figure 1C:
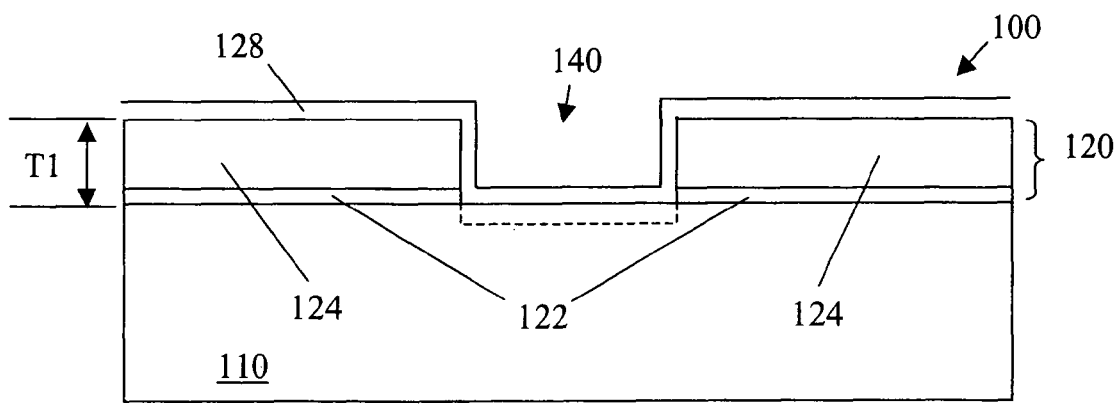
FIG. 1C shows the partially completed semiconductor wafer of FIG. 1B having the photoresist layer removed and addressing carbon incorporated in the device structure according to the present invention.

FIGS. 1A-1C show a cross-section of a device 100 including a substrate 110 during various processing stages according to embodiments of the invention. Substrate 110 may represent a part of a wafer, or may be a wafer itself. The wafer may be a semiconductor wafer such as a silicon wafer. Substrate 110 may also be a structure or a layer formed on a wafer. Substrate 110 may include at least one of a non-conducting material, a conducting material, and a semiconducting material. Examples of non-conducting materials include oxide (e.g., $SiO_2$, $Al_2O_3$), nitride (e.g., $Si_3N_4$), and glass (borophosphosilicate glass-BPSG). Examples of conducting materials include aluminum, tungsten, other metals, and compound of metals. Examples of semiconducting materials include silicon, and silicon doped with other materials such as boron, phosphorous, and arsenic.

In embodiments represented by FIG. 1A, device 100 includes a device structure 120 formed over substrate 110. In one embodiment, the device structure 120 includes at least one of a non-conducting material, semiconducting material, and a conducting material. In another embodiment, device structure 120 includes multiple layers 122 and 124. Each of these multiple layers 122 and 124 may include at least one of a non-conducting material, semiconducting material, and a conducting material. In one illustrative embodiment, layer 122 is a tunneling oxide layer formed overlying the semiconductor substrate 110. Layer 124 is a polysilicon layer that overlays the tunneling oxide layer 122. In one embodiment, the polysilicon layer 124 is formed into a floating gate of a memory cell. In another embodiment, for example, layer 122 may be an oxide layer, and layer 124 may be a metal layer or a layer having a compound of metal and silicon. Device structure 120 has a thickness T1.

In the illustrated embodiment, multiple layers 122 and 124 are formed by growing or deposition or by other known processes. For example, in one embodiment, the tunneling oxide layer 122 may be formed either by a thermal oxidation of the semiconductor substrate 110 or by a chemical vapor deposition (CVD) process. In one embodiment, the polysilicon layer 124 is deposited using a low-pressure CVD process.

FIG. 1A shows device 100 with a mask (photoresist layer) 130 formed over device structure 120 and patterned. In one embodiment, the mask 130 is made of carbon. In another embodiment, the mask 130 is amorphous carbon. In still other embodiments, the mask 130 comprises amorphous carbon, polymeric resins, photo-sensitizers, organic solvents, and combinations thereof. In one embodiment, the mask 130 is also referred to as amorphous carbon layer. The amorphous carbon layer 130 may be formed and patterned by a method disclosed by U.S. Pat. No. 7,132,201, entitled "TRANSPARENT AMORPHOUS CARBON STRUCTURE IN SEMICONDUCTIVE DEVICES," which is hereby incorporated fully by reference.

Patterned amorphous carbon layer 130 of device 100 is formed with a thickness T2 which is sufficient to properly etch a device structure, such as device structure 120. In this example, the patterned amorphous carbon layer 130 is used as a mask to etch either a portion of device structure 120, or the entire device structure 120. In some embodiments, at least a portion of substrate 110 is also etched using the amorphous carbon layer 130 as a mask.

In using amorphous carbon layer 130 as a mask, the inventors have found that interfacial carbon 126, in the form of strongly bonded silicon-carbon bonds, is present in layer 124 when comprising polysilicon. It has been found that the interfacial carbon 126 originated during the deposition of the amorphous (or transparent) carbon layer in which the organic precursor used to form the amorphous carbon layer 130, forms chemisbored carbon at temperatures above 300° C. It has also been determined by the inventors, that the presence of the interfacial carbon 126 if not addressed (e.g., greatly reduced or substantially eliminated), will retard oxide growth in later processing steps, such as for example, providing a dielectric layer on polysilicon layer 124 that is used to form a gate on the substrate surface. Carbon remaining in the oxide dielectric can also be a source of traps and lead to degradation of device reliability through dielectric leakage and breakdown voltages.

FIG. 1B shows device 100 after device structure 120 is patterned. Patterning device structure 120 can be performed by one or more etching steps. In the illustrated embodiment, a trench 140 is formed as a result of the etching process. In other embodiments, one or more trenches may be formed. In embodiments represented by FIG. 1B, trench 140 is formed in at least portion of device structure 120. In some embodiments, trench 140 is formed in the entire device structure 120. In still other embodiments, trench 140 is formed in the entire device structure 120 and in at least a portion of substrate 110. For example, device structure 120 is etched to one level if conductive interconnects will be formed and device structure 120 is etched to another level if a component such as a capacitor will be formed.

After mask 130 is removed as shown in FIG. 1C, other processes can be performed to device 100 to form components such as transistors, capacitors, memory cell, or an integrated circuit such as a memory device, a processor, an application specific integrated circuit, or other types of integrated circuits. For example, in one embodiment, an interpoly dielectric layer 128 is provided which overlays the polysilicon layer 124. The interpoly dielectric layer 128 comprises an oxide, silicon dioxide, silicon nitride, or combinations thereof. In one embodiment, the interpoly dielectric layer 128, the polysilicon layer 124, and the tunneling oxide layer 122 form the floating gate 120 of a Flash EEPROM memory cell 100.

In some embodiments, multiple layers 122, 124, and 128 are arranged in an order different from the order shown in FIGS. 1A-1C. In some embodiments, one or more of the layers 122, 124, and 128 is omitted from device structure 120. In other embodiments, one or more additional layers similar to layers 122, 124, and 128 are added to device structure 120. However, the formation of the other devices is not the primary object of the present invention and is thus omitted. The process of removing mask 130 and addressing the interfacial carbon 126 (FIGS. 1A and 1B) chemisbored into polysilicon layer 124 according to the present invention is now disclosed herein.

Figure 2:
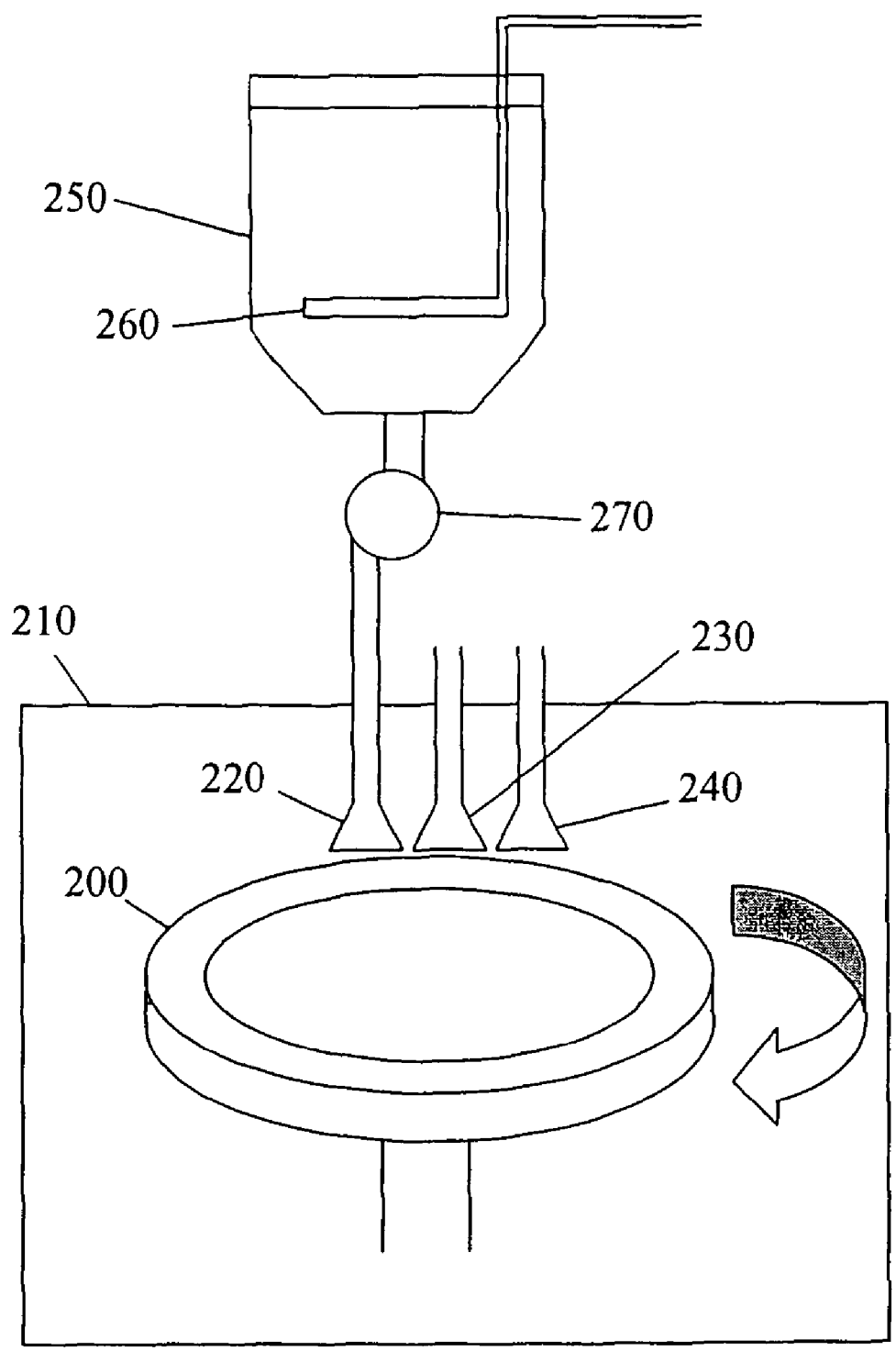
FIG. 2 is a schematic view of a system for removing a photoresist layer on a surface of a semiconductor wafer and addressing carbon incorporated in an interpoly oxide according to the present invention.

Referring FIG. 2, a schematic view of a system for removing a mask (photoresist layer) on a surface of a substrate according to the present invention is disclosed. Additionally, reference is made to FIG. 3A, depicting one embodiment of a process flow of the methodology according to the present invention.

As mentioned above, device 100 comprises mask 130 (FIG. 1A). After patterning, step 300, the device 100 is placed into a dry strip chamber (not shown) and the mask 130 is removed by conventional dry stripping techniques, in step 310. The device 100 is then placed on a horizontal rotator 200 in a wet clean chamber 210. The wet clean chamber also comprises nozzles 220, 230, and 240 which are employed to spray a first, second, and third solutions onto the surface of device 100, respectively, in subsequent cleaning processes. Alternatively, the nozzles 220, 230, and 240 may by designed as a single nozzle connected to different tanks containing different cleaning solutions.

Figure 3A:
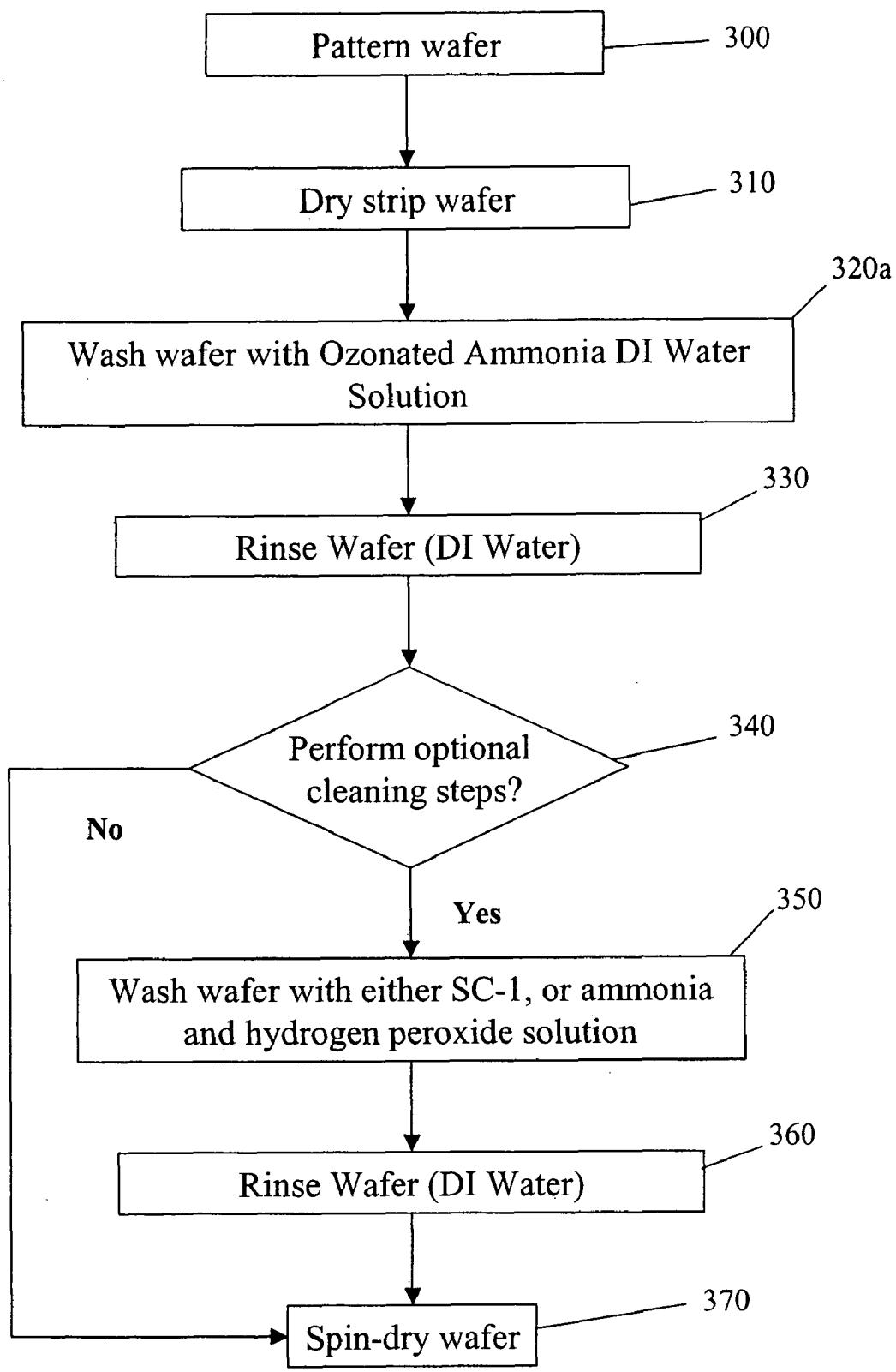
FIGS. 3A and 3B are flowcharts of the steps according to exemplary embodiments of the present invention.

Next the device 100 is subjected to a first cleaning process, in step 320a (FIG. 3A). The first cleaning process, utilizing a horizontal rotational rate of the rotator 200 ranging from 50 to 2500 rpm. A first cleaning solution is sprayed onto the surface of the device 100 via the first nozzle 220 to remove polymers, organic components, and/or interfacial carbon on or near the surface of the device 100. A suitable first solution has been found to comprise deionized water (DI water) containing ozone ($O_3$) in the range of 100 mg/L to 1000 mg/L and ammonia ($NH_3$) in the range of 0.02 wt % to 2 wt %. Such a first solution has been found to be suitable if applied to the surface of the device 100 at a temperature in the range from about 50° C. to about 95° C., and for a duration in the range from about 2 to about 20 minutes. The inventors determined that the use of a heated ozonated DI water by itself or a heated ammonia solution by itself were ineffective in removing the interfacial carbon 126 (FIG. 1B).

In the first cleaning process, in one embodiment ozone is introduced into a tank 250 containing a mixture of DI water and diluted ammonia. If desired, water may be used in place of DI water. The ozone may be introduced through dispersion tubes 260 located in the bottom of the tank 250. The mixture is allowed to become saturated with ozone for about 3 minute prior to being pumped by pump 270 and sprayed onto the device 100 via nozzle 220 with the resulting first cleaning solution.

In step 330, a second cleaning process utilizing a horizontal rotational rate ranging from 50 to 2500 rpm and having a duration of ranging from about 20 to about 300 seconds, is performed on the surface of the device 100. A second cleaning solution, comprising DI water, is sprayed onto the surface of the device 100 via the second nozzle 230 to remove the residual first cleaning solution on the surface of the device.

In step 340, it is determined if optional cleaning processes should be carried out. If so, in step 350 an optional third cleaning process, utilizing a horizontal rotational speed of the device 100 ranging from 500 to 2500 rpm and having a duration of approximately 5 to 40 seconds, is performed on the surface of the device 100. A third cleaning solution, comprising a standard cleaning solution (SC-1), such as 5:1:1 solution of water, hydrogen peroxide ($H_2O_2$), and ammonium hydroxide ($NH_4OH$), is sprayed onto the surface of the semiconductor wafer 100 via the third nozzle 240 to remove residual particles on the surface of the device 100.

In step 360, an optional fourth cleaning process, utilizing a horizontal rotational speed of the device 100 ranging from 500 to 2000 rpm and having a duration of approximately 5 to 40 seconds, is performed on the surface of the device 100. The second cleaning solution, comprising DI water, is sprayed onto the surface of the device 100 via the second nozzle 230 to remove the residual third cleaning solutions from the surface of the device 100.

Finally, in step 370 the device 100 is spun dry at a horizontal rotational speed ranging from 2000 to 2500 rpm for approximately 10 to 20 seconds.

Figure 3B:
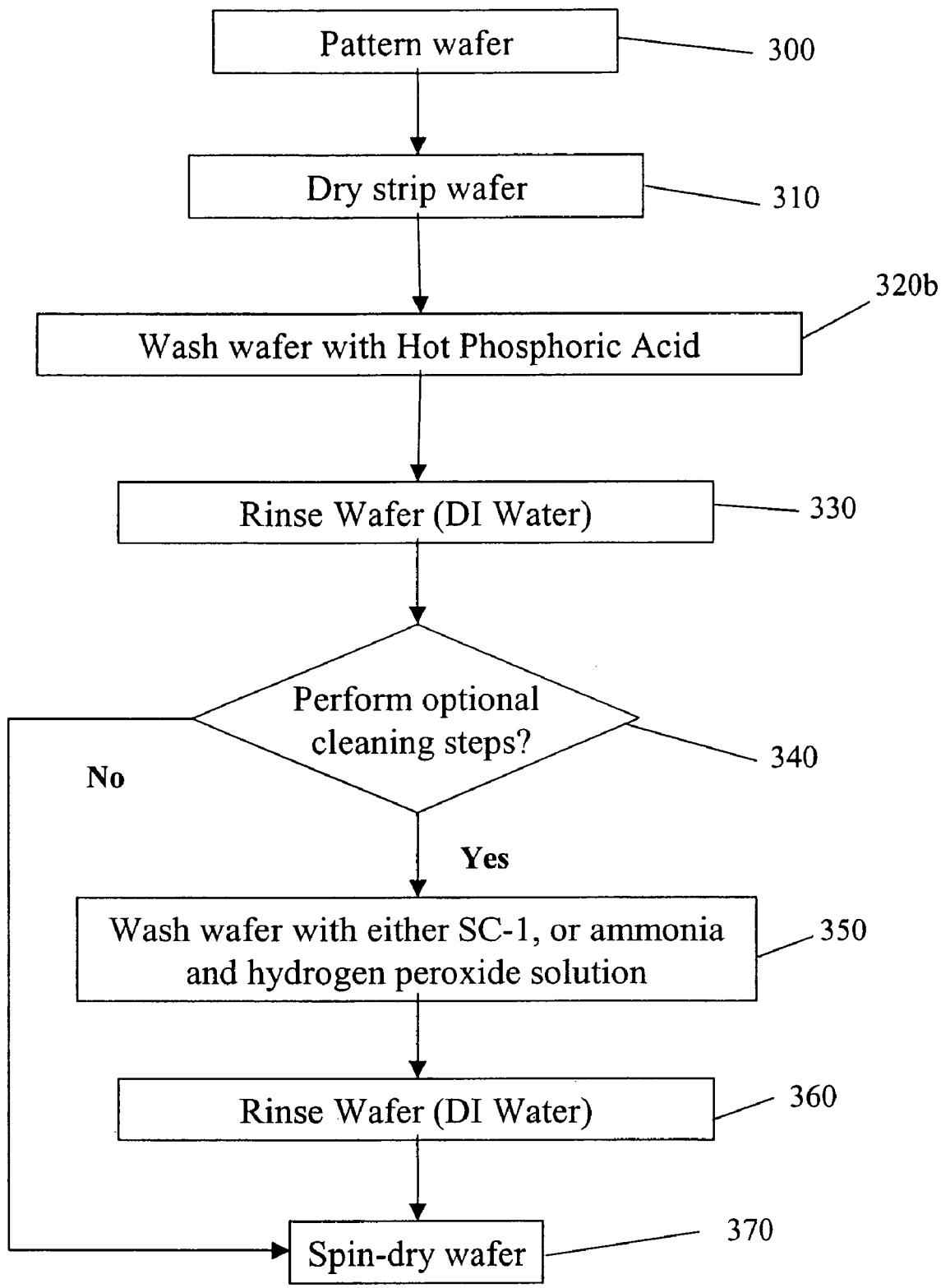

In another embodiment of the present invention depicted by FIG. 3B, the first cleaning process 320a (FIG. 3A) is replaced by placing the device 100 in a bath of hot phosphoric acid ($H_3PO_4$), in step 320b. While there are no upper or lower time limits for the immersion, an immersion time between 8 to 12 minutes appears suitable, with approximately 10 minutes being preferred. The temperature of the bath is held at a temperature in the range from about 160° C. to about 180° C. One skilled in the art will appreciate that the device 100 may be washed with the hot phosphoric acid by conventional methods other than a bath or immersion. For example, the hot phosphoric acid may be sprayed onto the surface of the device 100. Such a treatment has also been shown to be sufficient to remove all residual carbon.

After the hot phosphoric acid cleaning process, the remaining cleaning processes 330, 340, 370 may then be carried out including the optional cleaning processes 350 and 360, if desired. In another embodiment, a rinse may be performed by, for example, placing the device in a cascade overflow of DI water for approximately 5 minutes after immersion in the hot phosphoric acid. Ozone may be introduced in the cascading DI water rinse. The rinse steps may be performed in a manner other than a cascade overflow bath, such as immersion in a dump rinser, centrifugal spray cleaning, or through the use of rinser dryer devices.

The cleaning process of the present invention may be used for initially preparing the surface of the substrate 110, or may be used at other points in the fabrication process where interfacial carbon may be present and a clean surface is desired. In one embodiment, the cleaning step is used after dry-strip and prior to deposition of a dielectric oxide on a polysilicon layer. In such an embodiment, no retardation in oxide growth on the polysilicon layer was observed by using the above disclosed cleaning process. The first cleaning solution has an extremely high selectivity to polysilicon and oxide which is extremely important for flash memory manufacturing having a design scale below 70 nm.

Additionally, it is to be appreciated that undensified high density plasma (HDP) TEOS, formed by HDPCVD, in the field and polysilicon of a floating gate are exposed after patterning and mask removal. The first cleaning process using the described ammonia-ozonated DI water has an etch-rate of less than 1 A/min of polysilicon and less than 1.5 A/min for undensified HDP. The processes of the present invention thus enable the formation of a high-quality gate stack when using amorphous carbon to pattern a floating poly for use in NAND flash cell geometries. The present invention also reduces the requirement of using extra processing to reduce carbon formation—such as the use of any barrier layer (such as nitride) between the polysilicon and amorphous carbon to minimize interfacial carbon formation during deposition of the mask.

Although specific embodiments of, and examples for, the present invention are described herein for illustrative purposes, various equivalent modifications can be made without departing from the spirit and scope of the invention, as will be recognized by those skilled in the relevant art. The teachings provided herein of the present invention can be applied to other processes for microelectronic device fabrication, not necessarily the exemplary microelectronic device fabrication process generally described above. For example, rinse steps may be added or deleted while realizing the advantages of the invention.

These and other changes can be made to the invention in light of the above detailed description. In general, in the following claims, the terms used should not be construed to limit the invention to the specific embodiments disclosed in the specification and the claims, but should be construed to include all processes and compositions that operate in accordance with the claims to provide a method for manufacturing microelectronic devices. Accordingly, the invention is not limited by the disclosure, but instead its scope is to be determined entirely by the following claims.

What is claimed is:

1. A method of removing interfacial carbon from a device structure formed on a semiconductor wafer, the method comprising:
    providing the semiconductor wafer and device structure with interfacial carbon and a photoresist layer;
    performing a dry stripping process to remove the photoresist layer on the device structure;
    using a first cleaning solution to perform a first cleaning process to remove said interfacial carbon on or near a surface of the device structure, the first cleaning solution consisting of hot phosphoric acid ($H_3PO_4$);
    using a second cleaning solution to perform a second cleaning process to remove residual first cleaning solution on the surface of the device structure, the second cleaning solution being DI water; and
    spin-drying the semiconductor wafer.

2. The method of claim 1 wherein the semiconductor wafer is placed into a dry strip chamber to remove the photoresist layer on the device structure on the semiconductor wafer before performing the first and second cleaning processes.

3. The method of claim 2 wherein the dry stripping process is an ashing process using a plasma comprising oxygen or ozone to remove the photoresist layer on the device structure on the semiconductor wafer.

4. The method of claim 1 wherein the semiconductor wafer is placed on a rotator of a wet clean chamber to rotate the semiconductor wafer during the first and second cleaning processes.

5. The method of claim 1 wherein the first cleaning process utilizes a horizontal rotational rate of the semiconductor wafer that ranges from about 50 to about 2500 rpm, and has an approximate duration ranging from about 2 to about 20 minutes.

6. The method of claim 1 wherein the second cleaning process utilizes a horizontal rotational rate of the semiconductor wafer that ranges from about 50 to about 2500 rpm, and has an approximate duration ranging from about 20 to about 300 seconds.

7. The method of claim 1 wherein a horizontal rotational rate of the semiconductor wafer in the spin-drying process ranges from about 2000 to about 2500 rpm, and a duration of the spin-drying process ranges from about 10 to about 20 seconds.

8. The method of claim 1 wherein the wet cleaning chamber comprises a plurality of nozzles to spray the first and second solutions onto the surface of device structure on the semiconductor wafer in the first and second cleaning processes, respectively.

9. A method of removing a photoresist layer on a device structure formed on a semiconductor wafer, the method comprising:

performing a dry stripping process to remove the photoresist layer on the device structure;

horizontally rotating the semiconductor wafer and performing a wet cleaning process on the device structure, the wet cleaning process comprising:

using a first cleaning solution to perform a first cleaning process to remove particles on the surface of the device structure, the first cleaning solution consisting of hot phosphoric acid ($H_3PO_4$); and using a second cleaning solution to perform a second cleaning process to remove the first cleaning solution employed in the first cleaning process, the second cleaning solution being DI water, and spin-drying the semiconductor wafer.

10. The method of claim 9 wherein the dry stripping process is an ashing process.

11. The method of claim 10 wherein the ashing process uses a plasma comprising oxygen or ozone to remove the photoresist layer on the device structure on the semiconductor wafer.

12. The method of claim 9 wherein the first cleaning process utilizes a horizontal rotational rate of the semiconductor wafer that ranges from about 50 to about 2500 rpm and has an approximate duration ranging from about 2 to about 20 minutes.

13. The method of claim 9 wherein a horizontal rotational rate of the semiconductor in the second cleaning process ranges from about 50 to about 2500 rpm, and a duration of the second cleaning process ranges from about 20 to about 300 seconds.

14. The method of claim 9 wherein a horizontal rotational rate of the semiconductor wafer in the spin-drying process ranges from about 2000 to about 2500 rpm, and a duration of the spin-drying process ranges from about 10 to about 20 seconds.

15. A method of processing a wafer, the method comprising:

providing a wafer having a device structure with a polysilicon surface layer covered by amorphous carbon, thereby contaminating the polysilicon surface layer with interfacial carbon;

dry stripping the polysilicon surface layer;

washing the wafer with a solution consisting of hot phosphoric acid ($H_3PO_4$); and rinsing the wafer.

16. The method of claim 15 wherein the washing of the wafer has a duration in the range from about 2 to about 20 minutes.

17. The method of claim 15 wherein the washing of the wafer comprises heating the solution of hot phosphoric acid ($H_3PO_4$) to a temperature in the range from about 160° C. to about 180° C.

18. The method of claim 15, wherein the rinsing of the wafer comprises wetting the wafer with deionized water.

19. The method of claim 15 wherein the rinsing of the wafer comprises immersing the wafer in a cascade overflow of a deionized water and ozone solution.

20. The method of claim 15 wherein the washing comprises immersing the wafer in a bath of the hot phosphoric acid for about 8 to about 12 minutes, said bath of hot phosphoric acid having a temperature of between about 160° C. to about 180° C.

21. A method of manufacturing an electronic device, in which a device structure formed on a substrate is placed inside a process chamber and a surface of the substrate is subjected to a treatment comprising:

performing a dry stripping process to remove a mask layer on the device structure formed on the substrate;

horizontally rotating the substrate and performing a wet cleaning process on the device structure formed on the substrate, the wet cleaning process comprising:

using a first cleaning solution to perform a first cleaning process to remove particles on the surface of the device structure, the first cleaning solution consisting of hot phosphoric acid ($H_3PO_4$);

using a second cleaning solution to perform a second cleaning process to remove a first cleaning solution employed in the first cleaning process, the second cleaning solution being DI water;

using a third cleaning solution to perform an optional third cleaning process to remove particles on the surface of the semiconductor wafer; and using a fourth cleaning solution to perform an optional fourth cleaning process to remove a residual third cleaning solution employed in the third cleaning process if the optional third cleaning process is performed, the fourth cleaning solution being DI water; and spin-drying the device structure.

22. The method as claimed in claim 21, wherein the first, second, third, and fourth cleaning solutions are provided onto the surface of the substrate by spraying the cleaning solutions from at least one nozzle onto the surface of the device structure.

23. The method as claimed in claim 21, wherein at least the first cleaning solution is heated.

24. The method of claim 21 wherein a horizontal rotational rate of the semiconductor wafer in the third cleaning process ranges from about 500 to about 2500 rpm, and a duration of the third cleaning process ranges from about 5 to about 40 seconds.

25. The method of claim 21 wherein a horizontal rotational rate of the semiconductor wafer in the fourth cleaning process ranges from about 500 to about 2500 rpm, and a duration of the fourth cleaning process ranges from about 5 to about 40 seconds.

26. The method of claim 21 wherein a horizontal rotational rate of the semiconductor wafer in the spin-drying process ranges from about 2000 to about 2500 rpm, and a duration of the spin-drying process ranges from about 10 to about 20 seconds.

27. The method of claim 21 wherein the third cleaning solution is a standard cleaning solution (SC-1).

28. The method of claim 21 wherein the third cleaning solution is a 5:1:1 solution of water, hydrogen peroxide ($H_2O_2$), and ammonium hydroxide ($NH_4OH$).

* * * * *

UNITED STATES PATENT AND TRADEMARK OFFICE
CERTIFICATE OF CORRECTION

PATENT NO. : 7,806,988 B2
APPLICATION NO. : 10/951997
DATED : October 5, 2010
INVENTOR(S) : Niraj Rana et al.

It is certified that error appears in the above-identified patent and that said Letters Patent is hereby corrected as shown below:

On the Title page, item (57), under "Abstract", in column 2, line 2, delete "chemisbored" and insert -- chemisorbed --, therefor.

Signed and Sealed this

Seventh Day of December, 2010

David J. Kappos
*Director of the United States Patent and Trademark Office*